(12) United States Patent
Uesaka

(10) Patent No.: US 11,089,246 B2
(45) Date of Patent: Aug. 10, 2021

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Yusuke Uesaka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/758,038

(22) PCT Filed: Aug. 20, 2018

(86) PCT No.: PCT/JP2018/030633
§ 371 (c)(1),
(2) Date: Apr. 21, 2020

(87) PCT Pub. No.: WO2019/087527
PCT Pub. Date: May 9, 2019

(65) Prior Publication Data
US 2020/0322551 A1    Oct. 8, 2020

(30) Foreign Application Priority Data

Oct. 30, 2017 (JP) .............................. JP2017-208788

(51) Int. Cl.
*H04N 5/359* (2011.01)
*H04N 5/369* (2011.01)

(52) U.S. Cl.
CPC ......... *H04N 5/359* (2013.01); *H04N 5/36963* (2018.08)

(58) Field of Classification Search
CPC .. H04N 5/359; H04N 5/36963; H04N 5/3696; H04N 9/04551; H01L 27/146; G02B 27/28
See application file for complete search history.

(56) References Cited

U.S. PATENT DOCUMENTS

| | | | | |
|---|---|---|---|---|
| 8,564,700 | B2* | 10/2013 | Kanamori | H04N 9/045 348/280 |
| 10,481,313 | B2* | 11/2019 | Honda | H04N 5/369 |

(Continued)

FOREIGN PATENT DOCUMENTS

| | | |
|---|---|---|
| CN | 106461829 A | 2/2017 |
| CN | 107615485 A | 1/2018 |

(Continued)

OTHER PUBLICATIONS

International Search Report and Written Opinion of PCT Application No. PCT/JP2018/030633, dated Nov. 13, 2018, 13 pages of ISRWO.

*Primary Examiner* — Twyler L Haskins
*Assistant Examiner* — Angel L Garces-Rivera
(74) *Attorney, Agent, or Firm* — Chip Law Group

(57) ABSTRACT

Accuracy in obtaining polarization information can be improved in a solid-state imaging device including a polarization pixel. There is provided a solid-state imaging device including a plurality of polarization pixels that obtains a polarization signal of incident light, a semiconductor substrate on which the plurality of polarization pixels is arranged, and a circuit layer provided on a surface facing a surface of the semiconductor substrate on which the incident light is made incident, the circuit layer including a polarization pixel circuit that performs signal processing on the polarization signal obtained by the polarization pixels, in which a blank area that separates the plurality of polarization (Continued)

pixels from each other is provided over the entire circumference of the plurality of polarization pixels.

17 Claims, 11 Drawing Sheets

(56) References Cited

U.S. PATENT DOCUMENTS

| | | |
|---|---|---|
| 2014/0092227 A1 | 4/2014 | Kanamori et al. |
| 2017/0127024 A1 | 5/2017 | Yokogawa |
| 2017/0295308 A1 | 10/2017 | Ishimatsu |

FOREIGN PATENT DOCUMENTS

| | | |
|---|---|---|
| CN | 107924923 A | 4/2018 |
| JP | 2015-232599 A | 12/2015 |
| JP | 2017-005111 A | 1/2017 |
| JP | 2017-191989 A | 10/2017 |
| WO | 2013/175686 A1 | 11/2013 |
| WO | 2015/190291 A1 | 12/2015 |
| WO | 2016/199594 A1 | 12/2016 |
| WO | 2017/018258 A1 | 2/2017 |

\* cited by examiner

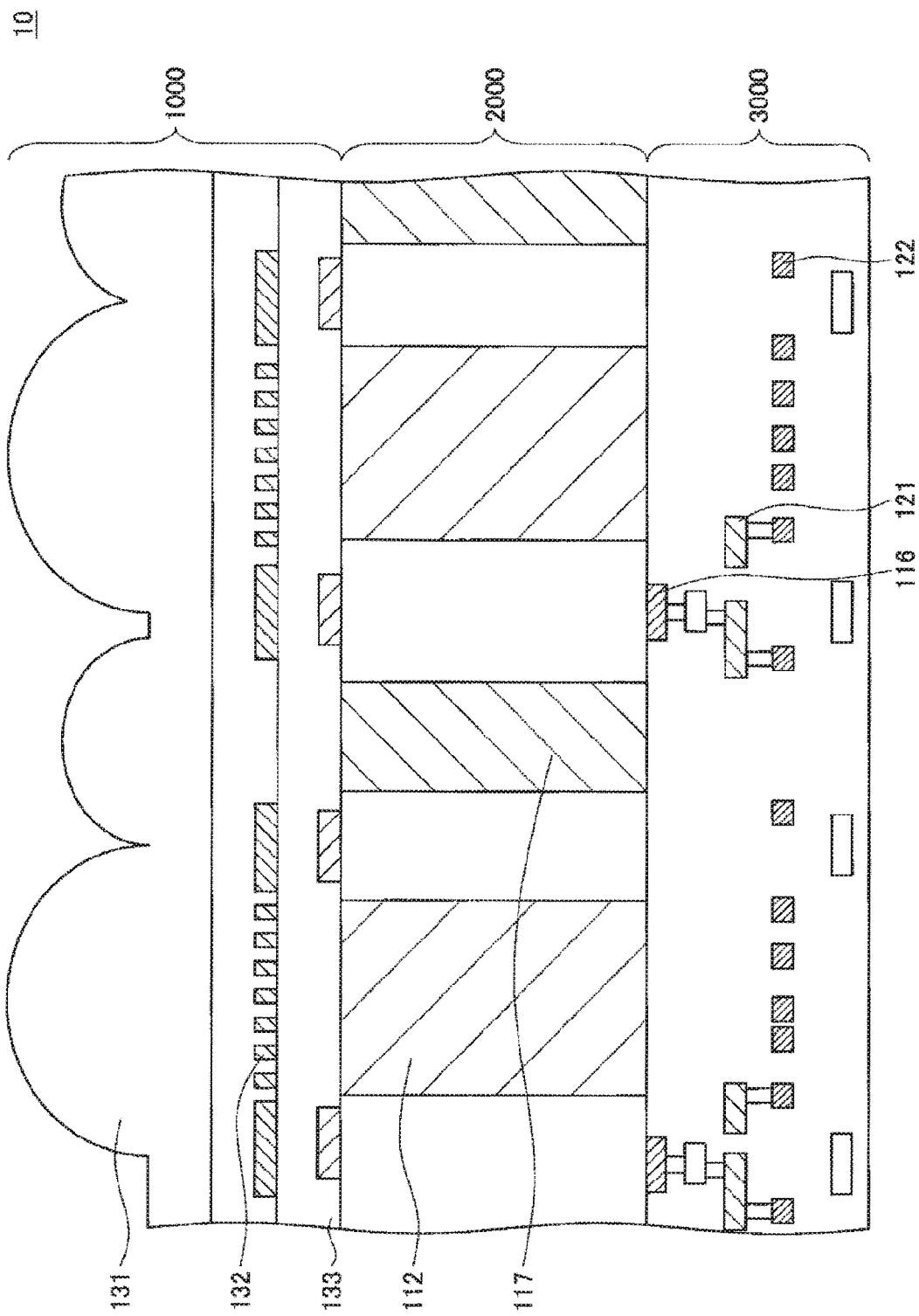

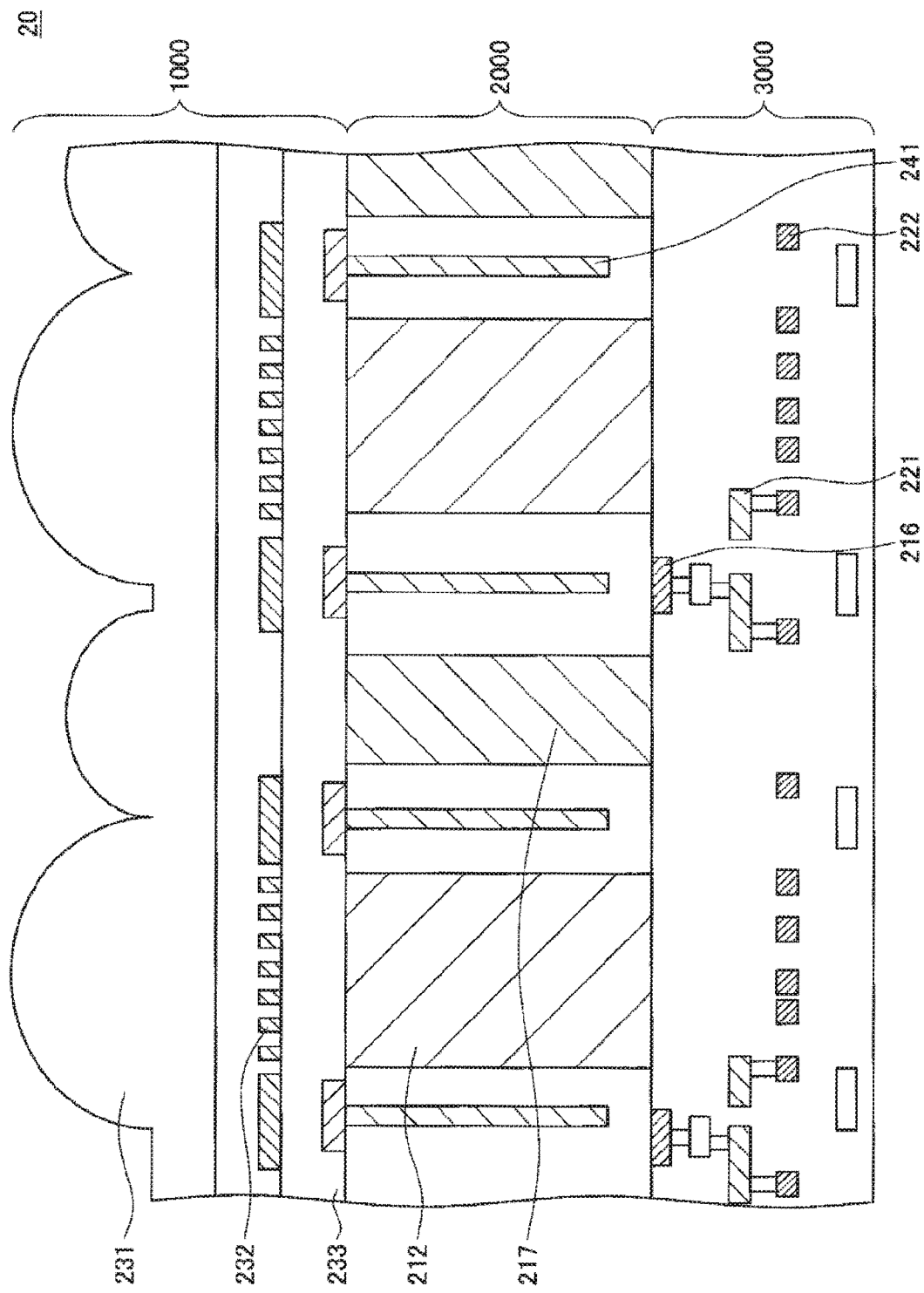

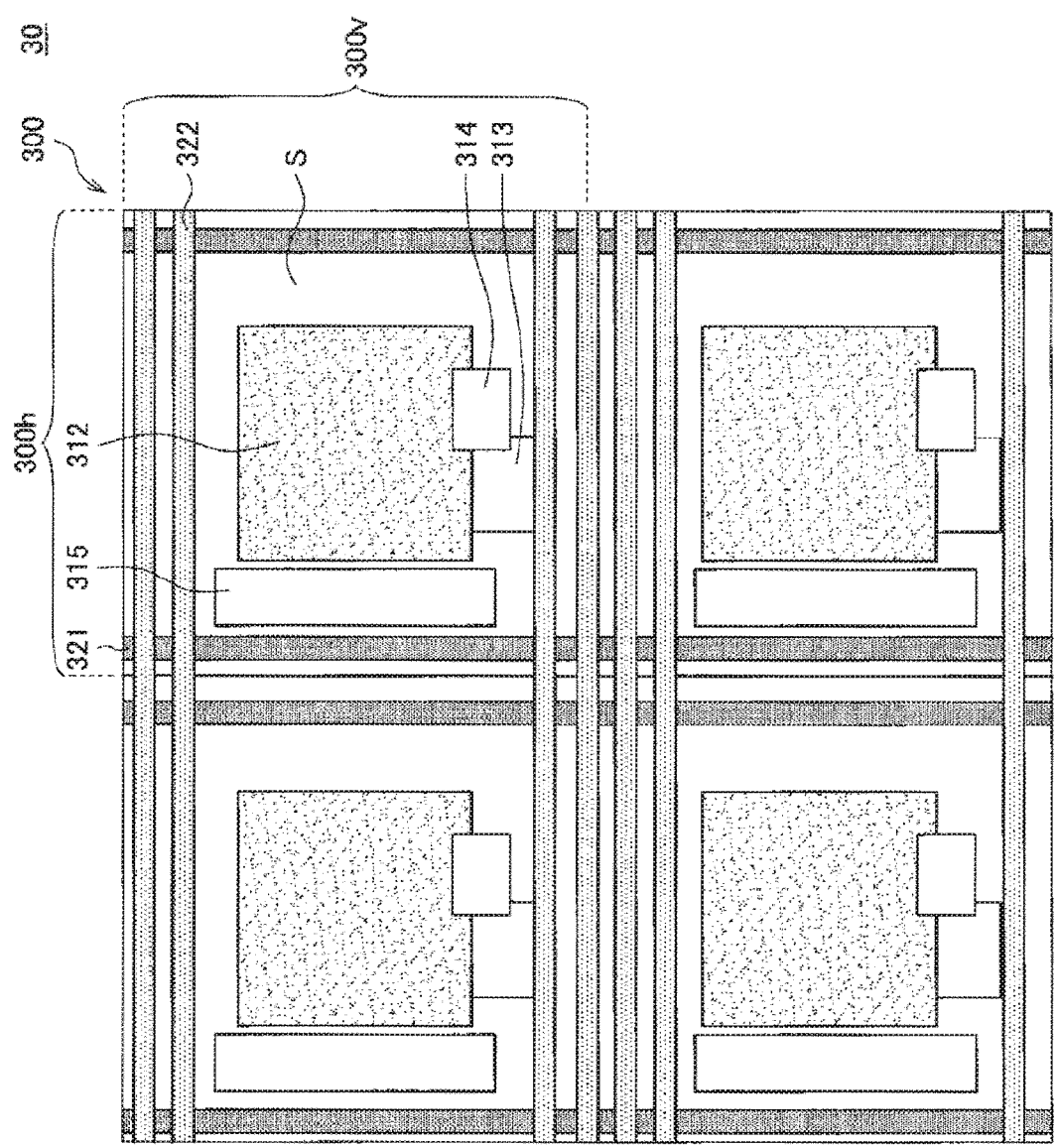

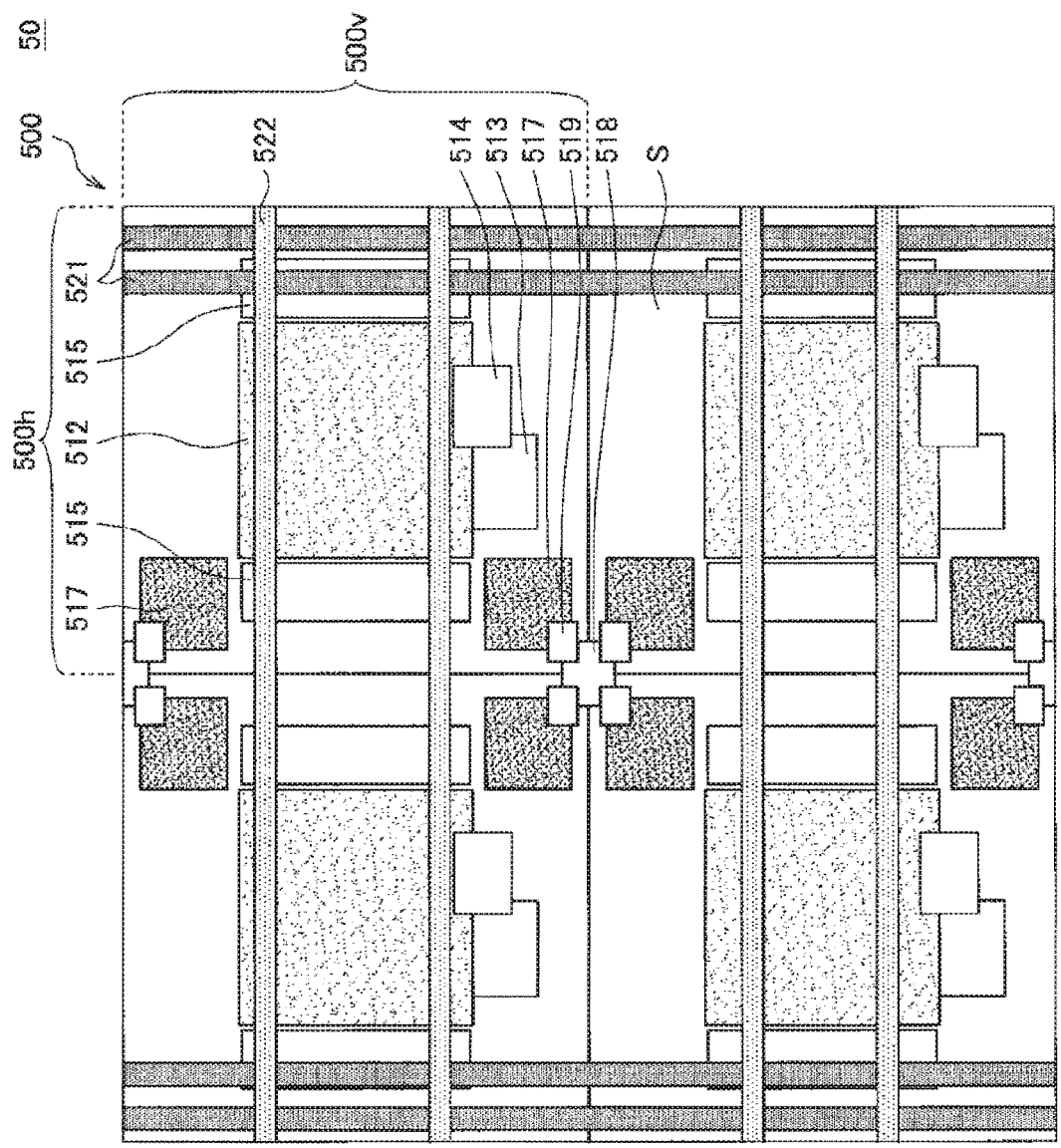

SOLID-STATE IMAGING DEVICE AND ELECTRONIC APPARATUS

CROSS REFERENCE TO RELATED APPLICATIONS

This application is a U.S. National Phase of International Patent Application No. PCT/JP2018/030633 filed on Aug. 20, 2018, which claims priority benefit of Japanese Patent Application No. JP 2017-208788 filed in the Japan Patent Office on Oct. 30, 2017. Each of the above-referenced applications is hereby incorporated herein by reference in its entirety.

TECHNICAL FIELD

The present disclosure relates to a solid-state imaging device and an electronic apparatus.

BACKGROUND ART

In recent years, detection of polarization information in a solid-state imaging device has been under development. For example, Patent Document 1 discloses a solid-state imaging device including color pixels and polarization pixels.

Specifically, Patent Document 1 discloses a technique for improving accuracy in obtaining color information and polarization information while making a color pixel having a color filter compatible with a polarization pixel having a polarizing member. Specifically, the solid-state imaging device disclosed in Patent Document 1 optimizes an array of color pixels and polarization pixels or a pixel cell size to simultaneously obtain color information, luminance information, and polarization information.

CITATION LIST

Patent Document

Patent Document 1: Japanese Patent Application Laid-Open No. 2017-5111

SUMMARY OF THE INVENTION

Problems to be Solved by the Invention

However, there has been a problem in the technique disclosed in Patent Document 1 in reducing crosstalk from an adjacent polarization pixel when obtaining polarization information using polarization pixels. Crosstalk represents leakage of light from an adjacent polarization pixel, and for example, crosstalk occurs when light not having passed through a polarizing member is made incident on a polarization pixel due to reflection of light from a circuit layer of the adjacent polarization pixel or the like. In a case where crosstalk occurs, an extinction ratio of the polarization pixel decreases, whereby it becomes difficult to obtain accurate polarization information.

The crosstalk as described above has not been sufficiently considered in Patent Document 1. Therefore, there is a possibility that the accuracy in obtaining polarization information can be improved in a solid-state imaging device including polarization pixels if crosstalk between the polarization pixels is further considered.

Solutions to Problems

According to the present disclosure, there is provided a solid-state imaging device including a plurality of polarization pixels that obtains a polarization signal of incident light, a semiconductor substrate on which the plurality of polarization pixels is arranged, and a circuit layer provided on a surface facing a surface of the semiconductor substrate on which the incident light is made incident, the circuit layer including a polarization pixel circuit that performs signal processing on the polarization signal obtained by the polarization pixels, in which a blank area that separates the plurality of polarization pixels from each other is provided over the entire circumference of the plurality of polarization pixels.

In addition, according to the present disclosure, there is provided an electronic apparatus including a solid-state imaging device that electronically images an object, in which the solid-state imaging device includes a plurality of polarization pixels that obtains a polarization signal of incident light, a semiconductor substrate on which the plurality of polarization pixels is arranged, and a circuit layer provided on a surface facing a surface of the semiconductor substrate on which the incident light is made incident, the circuit layer including a polarization pixel circuit that performs signal processing on the polarization signal obtained by the polarization pixels, and a blank area that separates the plurality of polarization pixels from each other is provided over the entire circumference of the plurality of polarization pixels.

According to the present disclosure, it becomes possible to suppress light that enters a polarization pixel without passing through a polarizing member.

Effects of the Invention

As described above, according to the present disclosure, it becomes possible to improve accuracy in obtaining polarization information in a solid-state imaging device including polarization pixels.

Note that the effect described above is not necessarily limited, and any of the effects described in the present specification or another effect that can be understood from the present specification may be exerted in addition to the effect described above or instead of the effect described above.

BRIEF DESCRIPTION OF DRAWINGS

FIG. 2A is a cross-sectional view taken along line A-A in FIG. 1B.

FIG. 3A is a diagram illustrating an example in which a light-shielding structure is added to the solid-state imaging device according to the embodiment.

FIG. 4A is a diagram illustrating a variation of the solid-state imaging device according to the embodiment.

FIG. 4C is a diagram illustrating still another variation of the solid-state imaging device according to the embodiment.

MODE FOR CARRYING OUT THE INVENTION

Hereinafter, a preferred embodiment of the present disclosure will be described in detail with reference to the accompanying drawings. Note that, in the present specification and the drawings, constituent elements having substantially the same functional configuration will be denoted by the same reference signs, and duplicate descriptions thereof will be omitted.

Descriptions will be given in the following order.
1. Embodiment
2. Variations
2.1. Arrangement of polarization pixels
2.2. Arrangement of normal pixels
2.3. Arrangement based on Pixel Sharing
3. Example of application

1. Embodiment

Figure 1A:
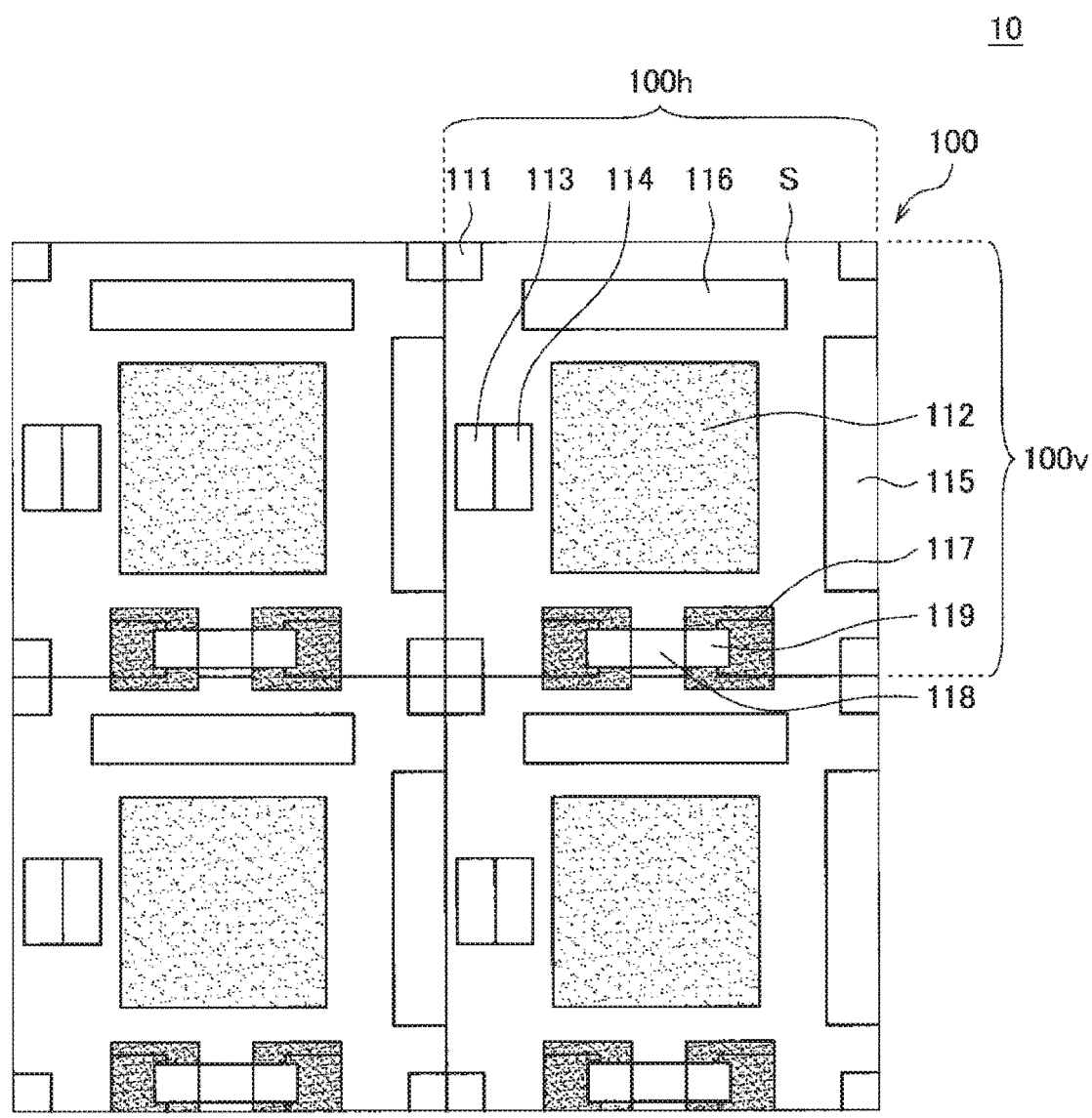
FIG. 1A is a plan view illustrating an exemplary solid-state imaging device according to the present embodiment.
Figure 1B:
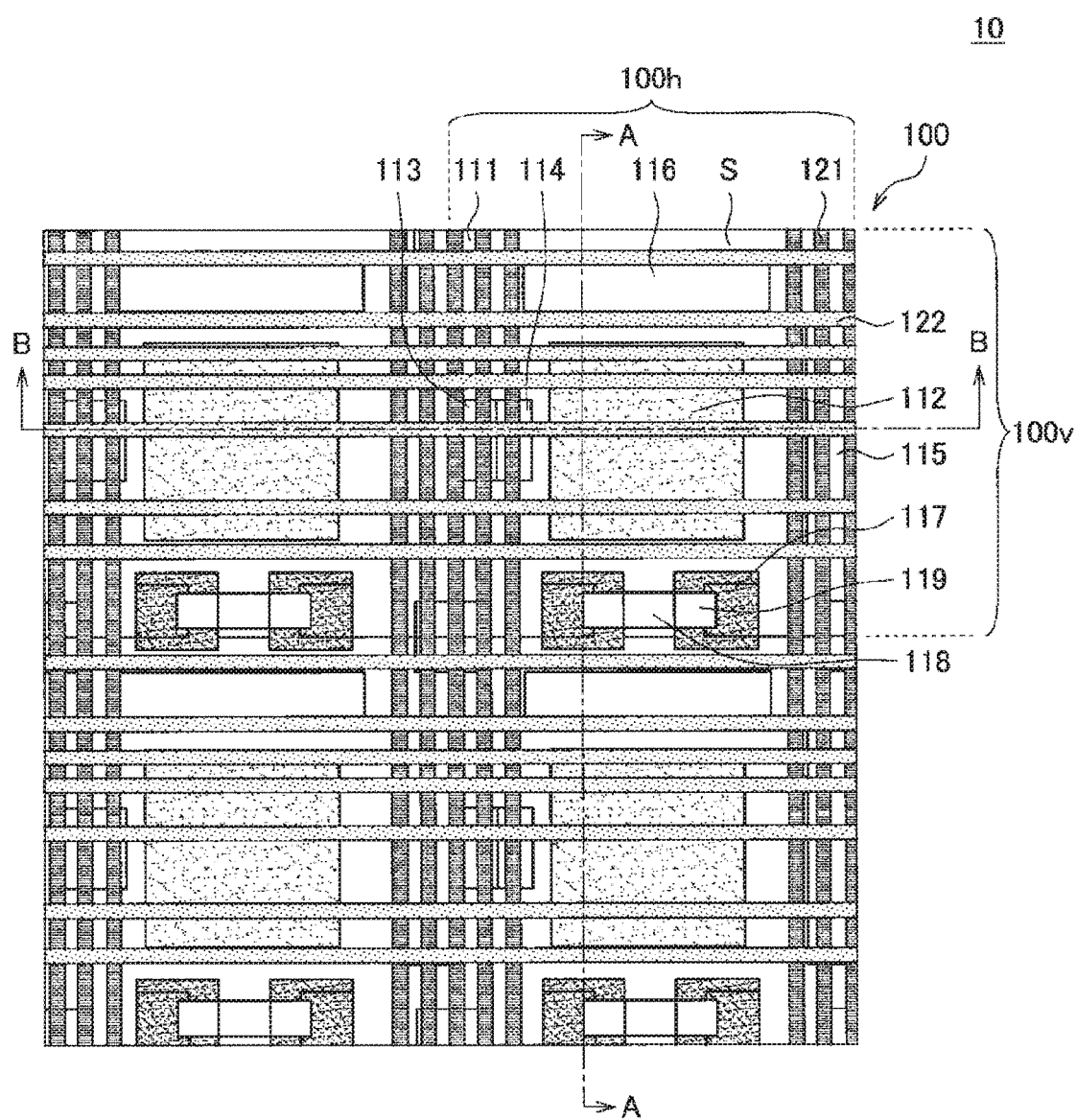
FIG. 1B is a plan view illustrating another exemplary solid-state imaging device according to the embodiment.
Figure 2B:
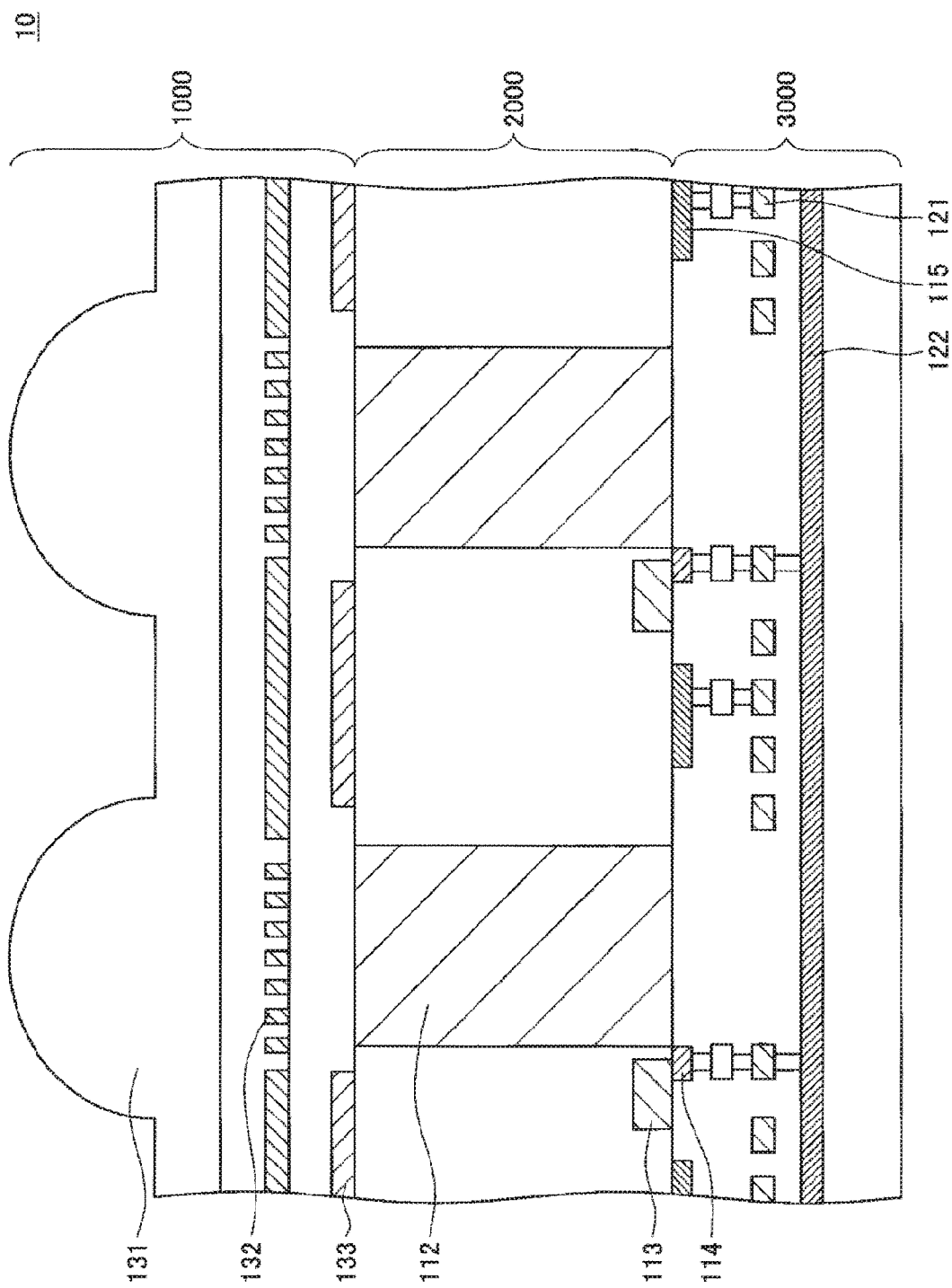
FIG. 2B is a cross-sectional view taken along line B-B in FIG. 1B.

First, a configuration of a solid-state imaging device according to the present embodiment will be described with reference to FIGS. 1A to 2B. FIGS. 1A and 1B are plan views of the solid-state imaging device according to the present embodiment, and FIGS. 2A and 2B are cross-sectional views of the solid-state imaging device according to the present embodiment. FIG. 2A is a cross-sectional view taken along line A-A in FIG. 1B, and FIG. 2B is a cross-sectional view taken along line B-B in FIG. 1B.

Note that, in the following descriptions, a surface through which incident light enters the solid-state imaging device will be referred to as an upper surface, and a surface facing the surface through which incident light enters will be referred to as a lower surface. In the plan views of the solid-state imaging device illustrated in FIGS. 1A and 1B, since incident light enters from the back side of a sheet face, the back side of the sheet face will be an upper surface and the front side of the sheet face will be a lower surface.

The solid-state imaging device according to the present embodiment has a structure including a lens layer, a semiconductor substrate, and a circuit layer in order from the surface through which incident light enters. FIG. 1A illustrates a layout of each component provided on, among the three layers, the semiconductor substrate on which polarization pixels are arranged. Referring to FIG. 1A, a solid-state imaging device 10 according to the present embodiment includes a pixel array in which a plurality of unit pixels 100 is arranged in array. FIG. 1A illustrates an area in which four unit pixels 100 are arranged. The unit pixel 100 may be, for example, an area in which a certain range 100h in a first direction and a certain range 100v in a second direction orthogonal to the first direction overlap with each other. Note that, in the following descriptions, a horizontal direction in the case where FIG. 1A is viewed from the front may be expressed as a first direction and a vertical direction may be expressed as a second direction.

The unit pixel 100 includes substrate contacts 111 provided on the semiconductor substrate, a polarization pixel 112 including a polarizing member (not illustrated), a polarization pixel floating diffusion (hereinafter referred to as polarization pixel FD) 113, a polarization pixel transfer transistor (hereinafter referred to as polarization pixel TRG) 114, a polarization pixel driving transistor group (hereinafter referred to as polarization pixel driving TRG) 115, a normal pixel 117, a normal pixel driving transistor group (hereinafter referred to as normal pixel driving TRG) 116, a normal pixel floating diffusion (hereinafter referred to as normal pixel FD) 118, and a normal pixel transfer transistor (hereinafter referred to as normal pixel TRG) 119. Furthermore, a blank area S is provided between the polarization pixels of each unit pixel 100.

The solid-state imaging device 10 obtains polarization information via the polarization pixel using the structure as described above. Specifically, first, the polarization pixel 112 photoelectrically converts the light having passed through the polarizing member to generate an electric charge according to the amount of received light. The generated electric charge is transferred to the polarization pixel FD 113 via the polarization pixel TRG 114. The electric charge transferred to the polarization pixel FD 113 is obtained as polarization information by being read by the polarization pixel driving TRG group 115 as appropriate.

Next, each structure will be described.

The semiconductor substrate is a substrate on which the unit pixels 100 including the polarization pixels 112 are provided in array. The semiconductor substrate may be, for example, a silicon (Si) substrate. Alternatively, the semiconductor substrate may be what is called a silicon on insulator (SOI) substrate in which an insulating film, such as $SiO_2$, is sandwiched inside a silicon substrate. Moreover, the semiconductor substrate may be a compound semiconductor substrate, such as a gallium arsenic (GaAs) substrate, a gallium nitride (GaN) substrate, and a silicon carbide (SiC) substrate, or may be a substrate obtained by forming a film of a semiconductor layer, such as silicon (Si), on a substrate other than a semiconductor material, such as sapphire.

The substrate contacts 111 are provided at, for example, the four corners of the unit pixel 100. Each substrate contact 111 electrically connects the semiconductor substrate with power supply wiring or ground wiring to fix a potential of the semiconductor substrate to a predetermined potential (e.g., 0 V).

The polarization pixel 112 is a pixel that includes a polarizing member (not illustrated) and obtains polarization information. As will be described later, the polarizing member may be what is called a wire grid having a structure in which a plurality of conductive materials is arranged in parallel. The polarizing member transmits, out of the light transmitted through a slit between the conductive materials arranged in parallel, a polarization component in a direction orthogonal to the direction along which the conductive materials extend, and reflects or absorbs a polarization component in a direction parallel to the direction along which the conductive materials extend. Accordingly, the polarization pixel 112 can obtain, as polarization information, the light amount of the polarization component corresponding to the polarizing member. That is, the polarization pixel 112 transmits light in an optional polarization direction according to the direction of the slit of the polarizing member, whereby the polarization information of the light incident on the polarization pixel 112 can be obtained. Therefore, the solid-state imaging device 10 can detect a ratio of each polarization component in the incident light by using the polarization pixel 112 including the polarizing member that transmits light in different polarization directions.

The electric charge photoelectrically converted by the polarization pixel 112 is transferred to the polarization pixel FD 113. The polarization pixel FD 113 is provided on the semiconductor substrate in a similar manner to the polarization pixel. The electric charge transferred to the polarization pixel FD 113 is obtained as polarization information by being read by the polarization pixel driving TRG group 115 as appropriate.

The polarization pixel driving TRG group 115 includes various transistors used for driving the polarization pixel 112 related to acquisition of the polarization information. The polarization pixel driving TRG group 115 includes, for example, an amplifier transistor, a reset transistor, a selection transistor, or the like.

Referring to FIG. 1A, a plurality of the polarization pixels 112 is provided in a tetragonal lattice pattern with predetermined intervals in the first direction and the second direction orthogonal to the first direction. That is, blank areas S for separating the plurality of polarization pixels 112 from each other are provided over the entire circumference.

With the blank areas S being provided between the plurality of polarization pixels 112 as in the present embodiment, it becomes possible to suppress incidence of light on the polarization pixel 112 caused by reflection from other structures. Therefore, according to the present embodiment, crosstalk that occurs between the polarization pixels 112 can be suppressed, and the extinction ratio of the polarization pixels 112 can be improved, whereby the polarization pixels 112 can obtain the polarization information more accurately. Note that the width or size of the blank area S is not particularly limited as long as the polarization pixel 112 is separated from other polarization pixels over the entire circumference. As the blank area S is made wider, a degree of freedom of the arrangement position of other structures to be described later increases, and likelihood of crosstalk to the polarization pixel 112 caused by reflection from other structures can be reduced. Furthermore, an area of the polarization pixel 112 can be increased as the blank area S is made narrower, whereby the aperture area of the polarization pixel 112 can be increased.

In the blank area S, a transistor or the like that processes polarization signals obtained by the polarization pixel 112 may be provided. Specifically, the polarization pixel FD 113, the polarization pixel TRG 114, the polarization pixel driving TRG group 115, and the like may be provided. Referring to FIG. 1A, the polarization pixel FD 113 and the polarization pixel TRG 114 may be provided in the blank area S provided between the plurality of polarization pixels 112 in the first direction. Those polarization pixel FD 113 and the polarization pixel TRG 114 may be provided close to each other to exchange electric charges more quickly. Moreover, the polarization pixel driving TRG group 115 may be provided in the blank area S provided between the plurality of polarization pixels 112 in the first direction at a position close to the polarization pixel FD 113 and the polarization pixel TRG 114.

The polarization pixel driving TRG group 115, the polarization pixel FD 113, the polarization pixel TRG 114, and a polarization pixel circuit including wiring of those components and the like may be provided in a circuit layer in an area that overlaps the blank area S in a case where the semiconductor substrate is viewed in a plan view. That is, a polarization pixel circuit that performs signal processing on the polarization signals obtained by the polarization pixel 112 may be provided in a circuit layer provided below (in the direction away from the light incident surface) the blank area S.

Moreover, the normal pixel 117 that obtains pixel signals of a captured image from incident light may be provided in the blank area S. Referring to FIG. 1A, the normal pixel 117 may be provided in the blank area S provided between the plurality of polarization pixels 112 in the second direction (direction orthogonal to the first direction).

The normal pixel 117 is a pixel that obtains pixel signals of a captured image from incident light. The pixel signals are signals related to each pixel of a color image or a monochrome image obtained by electronically capturing a subject. A color filter and a pixel defining film (also referred to as black matrix) is provided on the upper surface (in the direction approaching the light incident surface) of the normal pixel 117, and the normal pixel 117 can obtain pixel signals of a color corresponding to the color filter. With such a normal pixel 117 being provided in the blank area S, the solid-state imaging device 10 can obtain not only polarization information but also image information of a captured image obtained by imaging a subject.

Furthermore, in a case where the normal pixel 117 is provided, a transistor or the like that processes the pixel signals obtained by the normal pixel 117 may be provided in the blank area S. Specifically, the normal pixel driving TRG group 116, the normal pixel FD 118, and the normal pixel TRG 119 may be provided. Referring to FIG. 1A, the normal pixel FD 118 and the normal pixel TRG 119 may be provided close to the normal pixel 117 in the blank area S provided between the plurality of polarization pixels 112 in the second direction. With this arrangement, the normal pixel FD 118 and the normal pixel TRG 119 can exchange electric charges more quickly. Moreover, the normal pixel driving TRG group 116 may be provided in the blank area S provided between the plurality of polarization pixels 112 in the second direction at a position close to the normal pixel FD 118 and the normal pixel TRG 119.

The normal pixel driving TRG group 116, the normal pixel FD 118, the normal pixel TRG 119, and a normal pixel circuit including wiring of those components and the like may be provided in a circuit layer in an area that overlaps the blank area S in a case where the semiconductor substrate is viewed in a plan view. That is, a normal pixel circuit that performs signal processing on the pixel signals obtained by the normal pixel 117 may be provided in a circuit layer provided below (in the direction away from the light incident surface) the blank area S.

Note that the size of the normal pixel 117 is not limited. The detection sensitivity of the normal pixel 117 can be improved as the area of the normal pixel 117 is larger. On the other hand, as the area of the normal pixel 117 is smaller, a degree of freedom of the arrangement layout of other configurations provided in the blank area S increases. Moreover, the number of the normal pixels 117 is also not limited. However, as the number of the normal pixels 117 increases, pixel information of a larger number of colors can be obtained.

Next, FIG. 1B will be described. FIG. 1B is a diagram illustrating a configuration of a circuit layer provided on the lower surface (surface facing the light incident surface) of FIG. 1A. For example, in the example illustrated in FIG. 1B, first wiring 122 is provided to extend in the first direction, and second wiring 121 is provided to extend in the second direction. Specifically, the first wiring 122 is driver wiring, which may be provided to extend in the first direction at a predetermined interval. The second wiring 121 is a vertical signal line or power source wiring, which may be provided to extend in the second direction only in an area overlapping the blank area S.

However, the first wiring 122 or the second wiring 121 may be provided only in an area overlapping the polarization pixel 112, or may be provided only in an area overlapping the blank area S.

The planar layout of the solid-state imaging device 10 according to the present embodiment has been described with reference to FIGS. 1A and 1B. Next, a cross-sectional structure of the solid-state imaging device 10 according to the present embodiment will be described with reference to FIGS. 2A and 2B. FIG. 2A illustrates a cross-sectional view taken along line A-A in FIG. 1B, and FIG. 2B illustrates a cross-sectional view taken along line B-B in FIG. 1B.

In FIGS. 2A and 2B, since incident light is made incident on a lens layer 1000, a semiconductor substrate 2000, and a circuit layer 3000 in that order, the side of the lens layer 1000 will be expressed as an upward direction, and the side of the circuit layer 3000 will be expressed as a downward direction. As illustrated in FIGS. 2A and 2B, the solid-state imaging device 10 according to the present embodiment may be what is called a back-illuminated solid-state imaging device.

Referring to FIGS. 2A and 2B, the solid-state imaging device 10 includes the lens layer 1000, the semiconductor substrate 2000, and the circuit layer 3000. The planar layout described with reference to FIG. 1A mainly corresponds to a planar layout related to the semiconductor substrate 2000, and the planar layout described with reference to FIG. 1B mainly corresponds to a planar layout related to the circuit layer 3000.

A configuration of the solid-state imaging device 10 will be described with reference to FIGS. 2A and 2B. The solid-state imaging device 10 is roughly divided into three layers of the lens layer 1000, the semiconductor substrate 2000, and the circuit layer 3000. Although an exemplary case where the solid-state imaging device 10 includes three layers has been described here, it is not limited to the case, and a publicly known configuration of a solid-state imaging device (e.g., multilayer solid-state imaging device, or the like) may be applied to the solid-state imaging device 10.

The lens layer 1000 includes an on-chip lens (OCL) 131, a polarizing member 132, and a pixel defining film 133.

The on-chip lens 131 includes, for example, an on-chip microlens. The on-chip lens 131 is provided on the polarization pixel 112 or the normal pixel 117 in such a manner that a pixel and a lens have one-to-one correspondence. The on-chip lens 131 can improve the sensitivity of the polarization pixel 112 or the normal pixel 117 by condensing light incident on the polarization pixel 112 or the normal pixel 117.

The polarizing member 132 is disposed on the upper surface of the polarization pixel 112 to cover the polarization pixel 112. The polarizing member 132 is, for example, a wire grid, which includes a plurality of strip-shaped conductive materials and a slit provided therebetween. The polarizing member 132 transmits a polarized wave having an electric field component in a direction orthogonal to the extending direction of the conductive material, and suppresses passage of a polarized wave having an electric field component parallel to the extending direction of the conductive material. As a conductive material included in the polarizing member 132, for example, a conductive material having a low complex refractive index in the wavelength region in which the polarization pixel 112 is sensitive is used, and examples of the conductive material can include aluminum, copper, gold, silver, platinum, tungsten, alloy containing those metals, and the like.

The pixel defining film 133 is provided on the upper surface of the polarization pixel 112 or the normal pixel 117 to partition each pixel area. Specifically, the pixel defining film 133 is provided to partition or fill between adjacent polarization pixels 112, normal pixels 117, or the like. The pixel defining film 133 may include, for example, a light-shielding member such as chromium and carbon. The pixel defining film 133 can improve the resolution of the solid-state imaging device 10 by suppressing incidence of light from between the polarization pixels 112 or the normal pixels 117 and suppressing leakage of light.

Note that, although illustration is omitted in FIGS. 2A and 2B, a color filter may be provided between the pixel defining films 133 on the normal pixel 117. With a color type of the color filter being changed, a color type of the pixel information to be obtained by the normal pixel 117 can be changed. As a color filter, for example, a red (R) filter that transmits light of a red wavelength band, a green (G) filter that transmits light of a green wavelength body, or a blue (B) filter that transmits light of a blue wavelength body may be used. Note that, in a case where no color filter is provided, the normal pixel 117 obtains monochrome pixel information.

Next, a configuration in the semiconductor substrate 2000 will be described. FIG. 2A is a cross-sectional view taken along line A-A in FIG. 1B, and the polarization pixels 112 and the normal pixels 117 are alternately disposed in the semiconductor substrate 2000. On the other hand, FIG. 2B is a cross-sectional view taken along line B-B in FIG. 1B, and only the polarization pixels 112 are arranged in the semiconductor substrate 2000. Note that, as mentioned with reference to FIGS. 1A and 1B, the arrangement of the polarization pixels 112 and the normal pixels 117 is not limited to the examples described above. Furthermore, the normal pixels 117 may not be provided.

Referring to FIGS. 2A and 2B, the polarization pixels 112 are provided to be separated from each other at predetermined intervals. Furthermore, the blank area S is provided between the polarization pixels 112. With this configuration, it becomes possible to suppress crosstalk in the polarization pixels 112 caused by reflected light from other configurations in the solid-state imaging device 10. For example, in a case where the light incident on the solid-state imaging device 10 reaches the circuit layer 3000, there is a possibility that the incident light is reflected by wiring or another structure in the circuit layer 3000, and randomly enters the polarization pixels 112 provided in the semiconductor substrate 2000 on the circuit layer 3000. In particular, in a case where the incident light is light that easily passes through an object, such as infrared rays and near infrared rays, it is highly likely that the incident light reaches a deeper region of the solid-state imaging device 10. According to the present embodiment, with the blank area S being provided, possibility that the reflected light from the wiring or other structures in the circuit layer 3000 enters the polarization pixel 112 can be reduced.

The configuration of the polarization pixel 112 and the normal pixel 117 provided in the semiconductor substrate 2000 may be, for example, a photodiode having a photoelectric conversion function. The photodiode provided in the semiconductor substrate 2000 photoelectrically converts the light that has made incident through the lens layer 1000, and discharges the generated electric charges to the circuit layer 3000. Note that, instead of the photodiode having a photoelectric conversion function, other photoelectric conversion elements such as an organic photoelectric conversion film can be used.

The semiconductor substrate 2000 may be, for example, a silicon (Si) substrate. Alternatively, the semiconductor substrate 2000 may be what is called a silicon on insulator (SOI) substrate in which an insulating film, such as $SiO_2$, is sandwiched inside the silicon substrate described above.

Moreover, the semiconductor substrate 2000 may be, for example, a compound semiconductor substrate, such as a gallium arsenic (GaAs) substrate, a gallium nitride (GaN) substrate, and a silicon carbide (SiC) substrate, or may be a substrate obtained by forming a film of a semiconductor layer, such as silicon (Si), on a substrate other than a semiconductor material, such as sapphire.

Next, a configuration in the circuit layer 3000 will be described. There are provided the polarization pixel driving TRG group 115, the polarization pixel TRG 114, the normal pixel TRG 119, the normal pixel driving TRG group 116, the first wiring 122, and the second wiring 121 in the circuit layer 3000.

For example, the first wiring 122 may be driver wiring. Specifically, the first wiring 122 may be electrically connected to terminals of each element, such as the polarization pixel driving TRG group 115, the polarization pixel TRG 114, the normal pixel TRG 119, and the normal pixel driving TRG group 116, to control driving of those elements. Furthermore, the second wiring 121 may be a vertical signal line or power source wiring. Specifically, the second wiring 121 may include a vertical signal line that reads signals from each pixel, or may include power source wiring that supplies power (voltage) to a control circuit or a signal processing circuit of each pixel. Note that the vertical signal line and the power source wiring may be disposed close to each other in the second wiring 121.

As illustrated in FIG. 2A, the first wiring 122 may not be provided in the circuit layer 3000 provided under the planar region occupied by the normal pixel 117. In such a case, it is possible to suppress occurrence of a situation in which the incident light that has passed through the normal pixel 117 and reached the circuit layer 3000 is reflected by the first wiring 122 to enter the neighboring polarization pixel 112.

Furthermore, the first wiring 122 may be provided in the circuit layer 3000 provided under the planar region occupied by the polarization pixel 112, for example. In such a case, the incident light that has passed through the polarization pixel 112 and reached the circuit layer 3000 can be made incident on the neighboring normal pixel 117 by being reflected by the first wiring 122. In the normal pixel 117, crosstalk of light having different polarization components is less likely to cause a problem, and sensitivity can be improved as an amount of received light increases. Accordingly, the solid-state imaging device 10 can improve the sensitivity of the normal pixel 117.

As illustrated in FIG. 2B, the second wiring 121 may be provided in the circuit layer 3000 provided under the blank area S. Since the pixel defining film 133 having a high light-shielding property is provided in the blank area S, the amount of incident light to reach the circuit layer 3000 is small. Therefore, even if the second wiring 121 is provided in the circuit layer 3000 under the blank area S, there is a low possibility that the incident light is unintentionally reflected. Therefore, according to such a configuration, it becomes possible to suppress unintended crosstalk of the incident light with respect to the polarization pixel 112 and the normal pixel 117.

Furthermore, the first wiring 122 may be uniformly provided in the circuit layer 3000 provided under the planar region occupied by the polarization pixel 112 and under the blank area S. In such a case, it is assumed that the incident light that has passed through the polarization pixel 112 and reached the circuit layer 3000 is reflected by the first wiring 122. However, since each of the polarization pixels 112 is separated from each other via the blank area S, there is a low possibility that the incident light reflected by the first wiring 122 reaches the adjacent polarization pixel 112. Therefore, according to such a configuration, it becomes possible to reduce the influence of the first wiring 122 exerted on the crosstalk of the polarization pixel 112.

Note that the configuration described above is provided in an insulating layer of the lens layer 1000 and the circuit layer 3000. The insulating layer is an element included in the layer structure of the solid-state imaging device 10, which includes an inorganic insulating material or an organic insulating material. For example, the insulating layer may include an inorganic insulating material such as silicon oxide, silicon nitride, and silicon oxynitride, or may include an organic insulating material such as resin.

The solid-state imaging device 10 according to the present embodiment has been described above.

Figure 3B:
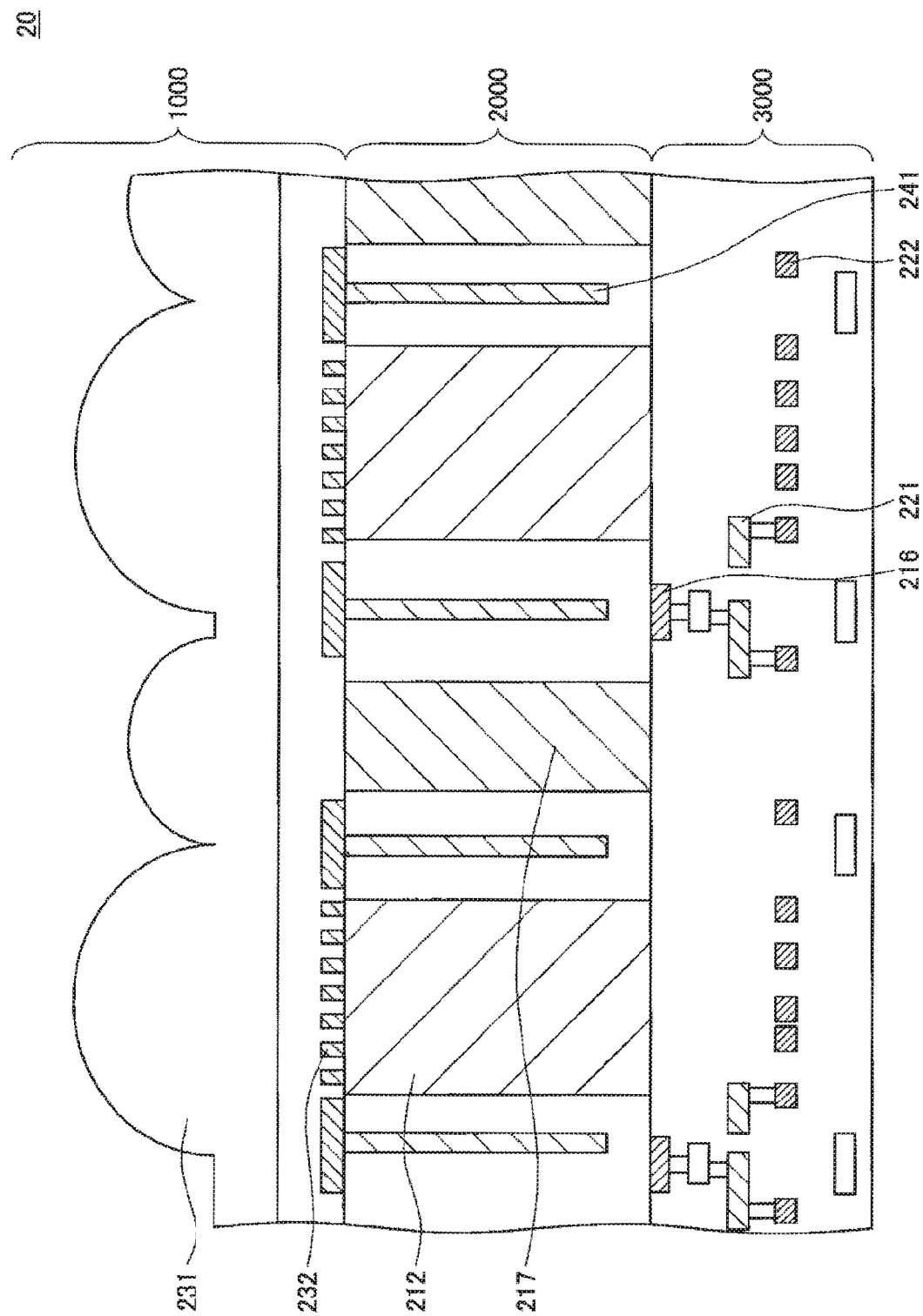
FIG. 3B is a diagram illustrating another example in which a light-shielding structure is added to the solid-state imaging device according to the embodiment.

Here, another exemplary cross-sectional structure of the solid-state imaging device 10 according to the present embodiment will be described with reference to FIGS. 3A and 3B. Solid-state imaging devices 20 illustrated in FIGS. 3A and 3B are an example and another example in which a light-shielding structure 241 is further provided in the exemplary cross-sectional structures illustrated in FIGS. 2A and 2B. Note that the cutting position of the cross-sectional structure of the solid-state imaging device 20 illustrated in FIGS. 3A and 3B corresponds to the cutting position of the cross-sectional structure of the solid-state imaging device 10 illustrated in FIG. 2A.

Note that an on-chip lens 231, a polarizing member 232, a pixel defining film 233, a polarization pixel 212, a normal pixel 217, a normal pixel driving TRG group 216, first wiring 222, and second wiring 221 in FIGS. 3A and 3B correspond to the on-chip lens 131, the polarizing member 132, the pixel defining film 133, the polarization pixel 112, the normal pixel 117, the normal pixel driving TRG group 116, the first wiring 122, and the second wiring 121 in FIG. 2A, and have substantially similar configurations, whereby descriptions thereof will be omitted.

The exemplary cross-sectional structure of the solid-state imaging device 20 illustrated in FIG. 3A is an example in which the light-shielding structure 241 is further provided between the respective pixels in the example illustrated in FIG. 2A. Specifically, the light-shielding structure 241 extending in the thickness direction of the semiconductor substrate 2000 may be provided between each of the polarization pixel 212 and the normal pixel 217. Note that, it is sufficient if at least one light-shielding structure 241 is provided between any of the polarization pixel 212 and the normal pixel 217. For example, it is sufficient if the light-shielding structure 241 is provided between the polarization pixels 212, between the normal pixels 217, or between the polarization pixel 212 and the normal pixel 217. Furthermore, it is sufficient if the light-shielding structure 241 is provided between at least any of the pixels. Since the light-shielding structure 241 can suppress leakage of light incident on the semiconductor substrate 2000 to the adjacent pixel, and can suppress crosstalk of the incident light between pixels, the solid-state imaging device 20 is enabled to accurately obtain polarization information or pixel signals.

A material of the light-shielding structure 241 is not particularly limited as long as it can shield or reflect light. For example, the light-shielding structure 241 may be formed to have a deep trench isolation (DTI) structure using an insulating inorganic oxynitride, such as silicon oxide ($SiO_x$), silicon nitride ($SiN_x$), and silicon oxynitride (SiON). In such a case, the light-shielding structure 241 functions as a reflector by being provided in the semiconductor substrate 2000 in such a manner that the refractive index satisfies the total reflection condition. Furthermore, the light-shielding structure 241 may function as a reflector by including a metal having a high light-shielding property, such as chromium and tungsten.

The exemplary cross-sectional structure of the solid-state imaging device 20 illustrated in FIG. 3B is different from the example illustrated in FIG. 3A in that the pixel defining film 233 and the polarizing member 232 are provided in the same layer. In such a case, the pixel defining film 233 can be omitted as illustrated in FIG. 3B. Specifically, in a case where the edge of the polarizing member 232 can implement the function of the pixel defining film 233, the pixel defining film 233 and the polarizing member 232 may be provided in the same layer, and the pixel defining film 233 may be omitted. Furthermore, in a case where the light-shielding structure 241 is provided in the solid-state imaging device 20, the light-shielding structure 241 suppresses crosstalk of light between the polarization pixel 212 and the normal pixel 217, whereby little influence is exerted even in a case where the pixel defining film 233 is omitted. The exemplary cross-sectional structure of the solid-state imaging device 20 illustrated in FIG. 3B can reduce the number of layers through which the light incident on the solid-state imaging device 20 passes before reaching the semiconductor substrate 2000 compared to the exemplary cross-sectional structure of the solid-state imaging device 20 illustrated in FIG. 3A. Accordingly, the loss of incident light is reduced in the solid-state imaging device 20, whereby the sensitivity of the solid-state imaging device 20 can be increased.

2. Variations

Next, variations of the planar layout of the solid-state imaging device according to the present embodiment will be described with reference to FIGS. 4A to 4C. Note that each variation to be described below may be applied to the embodiment described above alone, or may be applied to the embodiment described above in combination (i.e., in a mixed manner in a pixel array). Note that, in each variation to be described below, although configurations having the same names as the configurations described with reference to FIGS. 1A to 2B will be denoted by different reference signs for the sake of convenience, the configurations are substantially similar and detailed descriptions thereof will be omitted here.

[2.1. Arrangement of Polarization Pixels]

A planar layout illustrated in FIG. 4A is an example in which a normal pixel 117 is not provided in the planar layout illustrated in FIG. 1B.

As illustrated in FIG. 4A, a solid-state imaging device 30 includes a pixel array in which a plurality of unit pixels 300, which is configured in a region where a certain range 300h in a first direction overlaps with a certain range 300v in a second direction orthogonal to the first direction, is arranged in array. The solid-state imaging device 30 may include a polarization pixel 312, a polarization pixel FD 313, a polarization pixel TRG 314, a polarization pixel driving TRG group 315, first wiring 322, and second wiring 321.

In a similar manner to the embodiment described above, blank areas S for separating a plurality of the polarization pixels 312 from each other are provided over the entire circumference. The present variation is characterized in that the normal pixel 117 is not provided in the blank area S. With the normal pixel 117 not being provided, it is not required to provide a normal pixel circuit and wiring incidental to the normal pixel 117 in a circuit layer 3000. According to such a configuration, the area occupied by the circuit and wiring in the circuit layer 3000 can be reduced, whereby possibility that light having passed through a semiconductor substrate 2000 is reflected in the circuit layer 3000 to enter the polarization pixel 312 can be suppressed. Therefore, according to the present variation, the extinction ratio of the polarization pixel 312 can be improved.

[2.2. Arrangement of Normal Pixels]

Figure 4B:
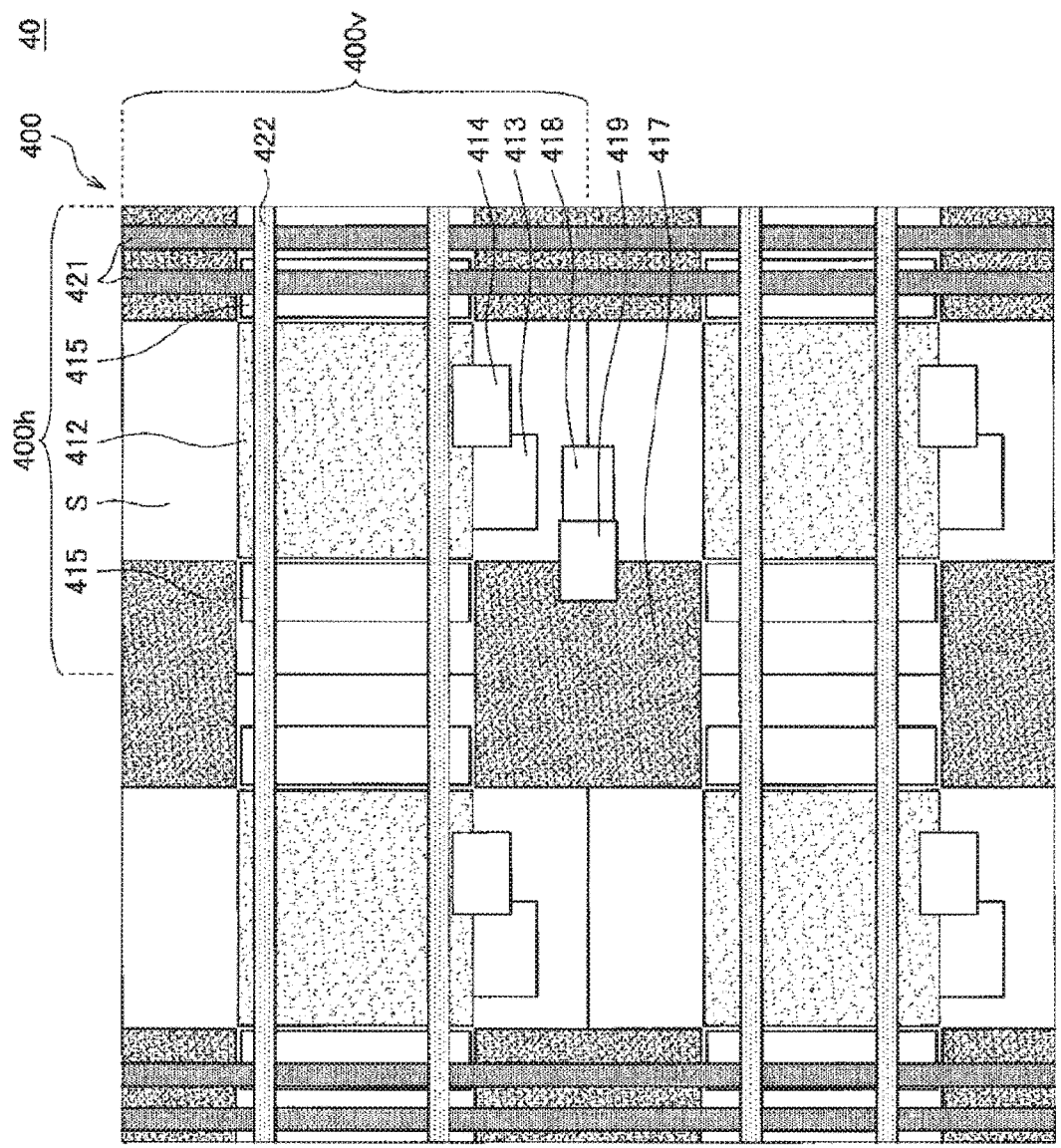
FIG. 4B is a diagram illustrating another variation of the solid-state imaging device according to the embodiment.

A planar layout illustrated in FIG. 4B is an example in which a size and arrangement of the normal pixel 117 are different from the planar layout illustrated in FIG. 1B.

As illustrated in FIG. 4B, a solid-state imaging device 40 includes a pixel array in which a plurality of unit pixels 400, which is configured in a region where a certain range 400h in the first direction overlaps with a certain range 400v in the second direction orthogonal to the first direction, is arranged in array. The solid-state imaging device 40 may include a polarization pixel 412, a polarization pixel FD 413, a polarization pixel TRG 414, a pixel driving TRG group 415 obtained by collecting a polarization pixel driving TRG group and a normal pixel driving TRG group, a normal pixel 417, a normal pixel FD 418, a normal pixel TRG 419, first wiring 422, and second wiring 421.

In a similar manner to the embodiment described above, blank areas S for separating a plurality of the polarization pixels 412 from each other are provided over the entire circumference. The present variation is characterized in that the normal pixel 417 is disposed on a diagonal line of a tetragonal lattice including the plurality of polarization pixels 412. According to the present variation, with the normal pixel 417 being disposed on the diagonal line of the plurality of polarization pixels 412 disposed in a tetragonal lattice pattern, the area of the normal pixel 417 can be increased. In other words, according to the present variation, the normal pixel 417 and the polarization pixel 412 can be arranged in a zigzag lattice pattern, whereby the normal pixel 417 and the polarization pixel 412 can be made to have similar sizes. Accordingly, the light receiving area of the normal pixel 417 can be increased, whereby the solid-state imaging device 40 can improve the sensitivity of the normal pixel 417.

[2.3. Arrangement Based on Pixel Sharing]

A planar layout illustrated in FIG. 4C is an example in which the normal pixel 417 is replaced with a plurality of normal pixels 517 in the planar layout illustrated in FIG. 4B.

As illustrated in FIG. 4C, a solid-state imaging device 50 includes a pixel array in which a plurality of unit pixels 500, which is configured in a region where a certain range 500h in the first direction overlaps with a certain range 500v in the second direction orthogonal to the first direction, is arranged in array. The solid-state imaging device 50 may include a polarization pixel 512, a polarization pixel FD 513, a polarization pixel TRG 514, a pixel driving TRG group 515 obtained by collecting a polarization pixel driving TRG group and a normal pixel driving TRG group, a plurality of normal pixels 517, a normal pixel FD 518, a plurality of normal pixel TRGs 519, first wiring 522, and second wiring 521.

In a similar manner to the embodiment described above, blank areas S for separating a plurality of the polarization pixels 512 from each other are provided over the entire circumference. The present variation is characterized in that the plurality of normal pixels 517 is disposed on a diagonal line of a tetragonal lattice including the plurality of polarization pixels 512, and also the plurality of normal pixels 517 shares the normal pixel FD 518. In the present variation, one normal pixel FD 518 is provided at the center of four normal pixels 517, and the plurality of normal pixels 517 shares the normal pixel FD 518. According to such a shared structure, even in a case where the number of the normal pixels 517 increases, the area occupied by a normal pixel circuit for performing signal processing after the normal pixel FD 518 is not required to increase, whereby a degree of freedom of the normal pixel circuit layout can be improved, and overcrowding of the circuit layer 3000 can be suppressed.

3. Example of Application

Note that the technology according to the present disclosure (present technology) can be applied to various products. For example, the technology according to the present disclosure may be implemented as a solid-state imaging device to be mounted on any type of mobile body such as a vehicle, electric vehicle, hybrid electric vehicle, motorcycle, and bicycle.

Figure 5:
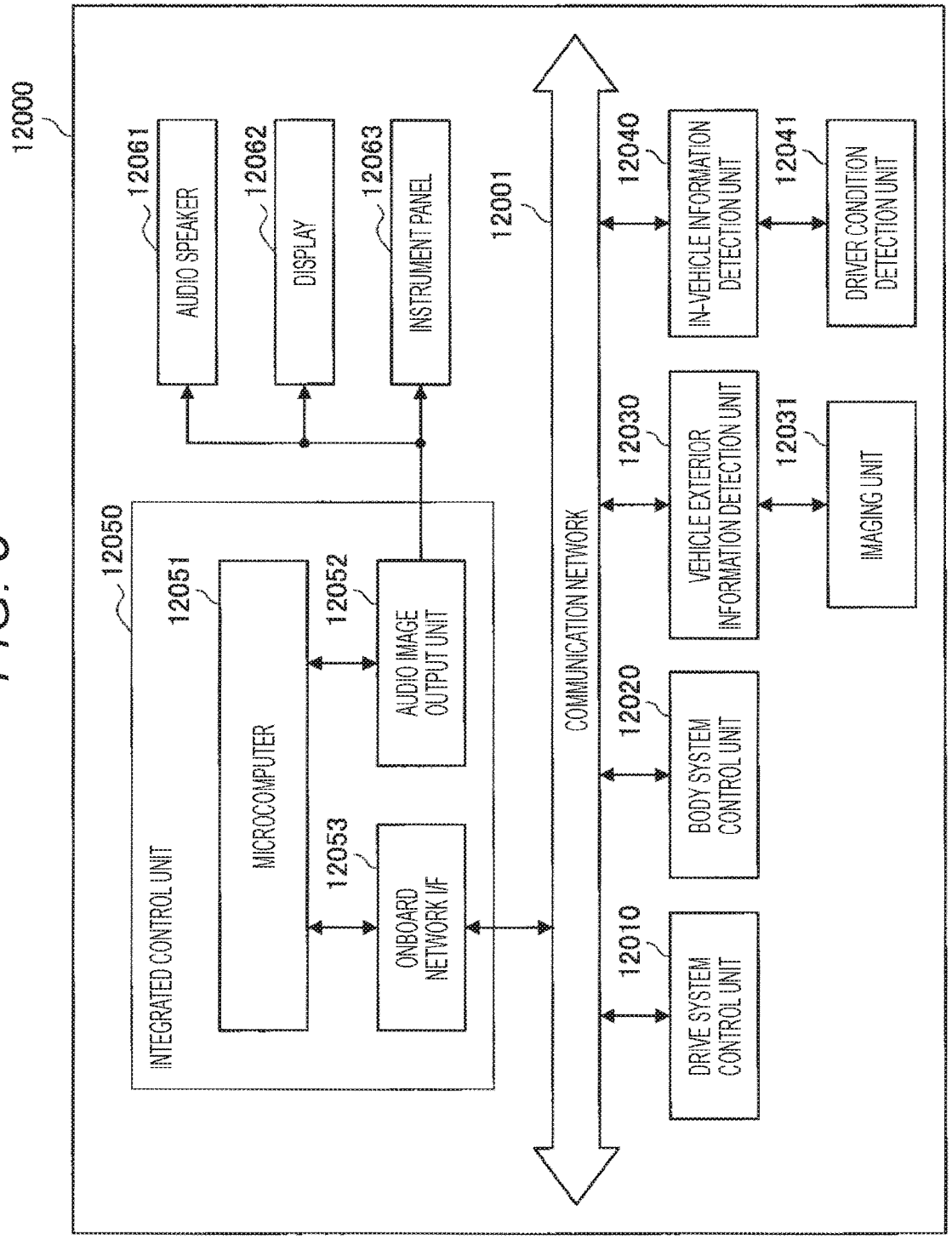
FIG. 5 is a block diagram illustrating an exemplary schematic configuration of a vehicle control system.

FIG. 5 is a block diagram illustrating a schematic exemplary configuration of a vehicle control system as an example of a mobile body control system to which the technology according to the present disclosure can be applied.

A vehicle control system 12000 includes a plurality of electronic control units connected via a communication network 12001. In the example illustrated in FIG. 5, the vehicle control system 12000 includes a drive system control unit 12010, a body system control unit 12020, a vehicle exterior information detection unit 12030, an in-vehicle information detection unit 12040, and an integrated control unit 12050. Furthermore, as a functional configuration of the integrated control unit 12050, a microcomputer 12051, an audio image output unit 12052, and an onboard network interface (I/F) 12053 are illustrated in the drawing.

The drive system control unit 12010 controls operation of a device related to a drive system of a vehicle according to various programs. For example, the drive system control unit 12010 functions as a control device of a driving force generation device for generating driving force of a vehicle such as an internal-combustion engine and a driving motor, a driving force transmission mechanism for transmitting driving force to wheels, a steering mechanism for adjusting a steering angle of a vehicle, a braking device for generating braking force of a vehicle, and the like.

The body system control unit 12020 controls operation of various devices installed on a vehicle body according to various programs. For example, the body system control unit 12020 functions as a control device of a keyless entry system, a smart key system, a power window device, or various lamps such as a head lamp, a back lamp, a brake lamp, a turn indicator, and a fog lamp. In this case, in the body system control unit 12020, radio waves transmitted from a portable device substituted for a key or signals of various switches may be input. The body system control unit 12020 receives input of those radio waves or the signals, and controls a door lock device of a vehicle, a power window device, a lamp, and the like.

The vehicle exterior information detection unit 12030 detects information regarding the outside of the vehicle on which the vehicle control system 12000 is installed. For example, an imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform, on the basis of the received image, detection processing of an object such as a person, a vehicle, an obstacle, a sign, and a character on a road, or distance detection processing.

The imaging unit 12031 is an optical sensor that receives light and outputs electric signals corresponding to the amount of the received light. The imaging unit 12031 can output the electric signals as an image, or as information regarding the distance measurement. Furthermore, the light received by the imaging unit 12031 may be visible light, or may be invisible light such as infrared rays.

The in-vehicle information detection unit 12040 detects information regarding the inside of the vehicle. For example, a driver condition detection unit 12041 for detecting condition of a driver is connected to the in-vehicle information detection unit 12040. The driver condition detection unit 12041 includes, for example, a camera for imaging the driver, and the in-vehicle information detection unit 12040 may calculate a fatigue degree or a concentration degree of the driver or may determine whether the driver is dozing off on the basis of the detected information input from the driver condition detection unit 12041.

The microcomputer 12051 can calculate a control target value of the driving force generation device, the steering mechanism, or the braking device on the basis of the information regarding the outside/inside of the vehicle obtained by the vehicle exterior information detection unit 12030 or the in-vehicle information detection unit 12040, and can output a control command to the drive system control unit 12010. For example, the microcomputer 12051 can perform cooperative control aiming at implementation of a function of the advanced driver assistance system (ADAS) including collision avoidance or impact mitigation of the vehicle, following travel based on the distance between vehicles, vehicle speed maintenance traveling, vehicle collision warning, vehicle lane departure warning, and the like.

Furthermore, the microcomputer 12051 controls the driving force generation device, the steering mechanism, the braking device, or the like on the basis of the information regarding the surroundings of the vehicle obtained by the vehicle exterior information detection unit 12030 or the in-vehicle information detection unit 12040, whereby cooperative control aiming at autonomous driving for autonomously traveling without being dependent on the operation of the driver and the like can be performed.

Furthermore, the microcomputer 12051 can output a control command to the body system control unit 12030 on the basis of the information regarding the outside of the vehicle obtained by the vehicle exterior information detection unit 12030. For example, the microcomputer 12051 can perform cooperative control aiming at anti-glaring such as switching from the high beam to the low beam by controlling the head lamp according to the position of a leading vehicle or an oncoming vehicle detected by the vehicle exterior information detection unit 12030.

The audio image output unit 12052 transmits at least one of output signals of audio or an image to an output device capable of visually or audibly notifying an occupant of the vehicle or the outside of the vehicle of information. In the example of FIG. 5, an audio speaker 12061, a display 12062, and an instrument panel 12063 are exemplified as the output device. The display 12062 may include, for example, at least one of an onboard display or a head-up display.

Figure 6:
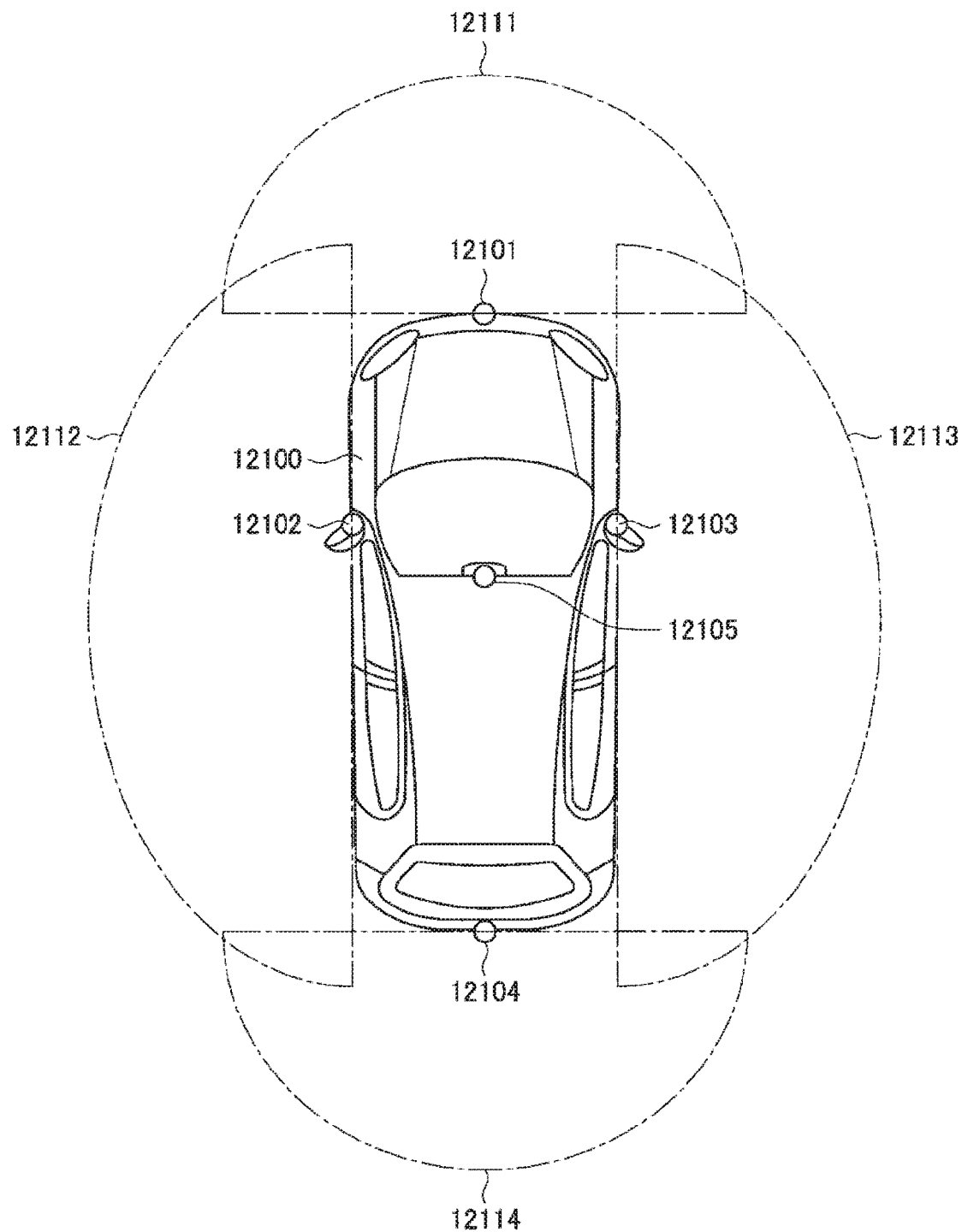
FIG. 6 is an explanatory diagram illustrating exemplary positions for installing a vehicle exterior information detection unit and an imaging unit.

FIG. 6 is a diagram illustrating an example of an installation position of the imaging unit 12031.

In FIG. 6, as the imaging unit 12031, imaging units 12101, 12102, 12103, 12104, and 12105 are included.

The imaging units 12101, 12102, 12103, 12104, and 12105 are provided at, for example, a position such as a front nose of a vehicle 12100, a side mirror, a rear bumper, a back door, and an upper portion of a vehicle interior windshield. The imaging unit 12101 provided on the front nose and the imaging unit 12105 provided on the upper portion of the vehicle interior windshield mainly obtain an image in front of the vehicle 12100. The imaging units 12102 and 12103 provided on the side mirrors mainly obtain an image of the lateral sides of the vehicle 12100. The imaging unit 12104 provided on the rear bumper or the back door mainly obtains an image behind the vehicle 12100. The imaging unit 12105 provided on the upper portion of the vehicle interior windshield is mainly used for detecting a leading vehicle, a pedestrian, an obstacle, a traffic signal, a traffic sign, a lane, and the like.

Note that an exemplary imaging range of the imaging units 12101 to 12104 is illustrated in FIG. 6. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, image data captured by the imaging units 12101 to 12104 are superimposed, whereby an overhead image of the vehicle 12100 viewed from above can be obtained.

At least one of the imaging units 12101 to 12104 may have a function of obtaining distance information. For example, at least one of the imaging units 12101 to 12104 may be a stereo camera including a plurality of image pickup devices, or may be an image pickup device having pixels for detecting phase difference.

For example, the microcomputer 12051 calculates, on the basis of the distance information obtained from the imaging units 12101 to 12104, a distance to each three-dimensional object within the imaging ranges 12111 to 12114 and a temporal change of the distance (relative speed with respect to the vehicle 12100), whereby particularly a three-dimensional object traveling at a predetermined speed (e.g., 0 km/h or more) in substantially the same direction as the vehicle 12100, which is the closest three-dimensional object on the traveling path of the vehicle 12100, can be extracted as a leading vehicle. Moreover, the microcomputer 12051 can perform automatic brake control (including following travel stop control), automatic acceleration control (including following travel start control), and the like by setting the distance between vehicles to be secured in advance before a leading vehicle. In this manner, the cooperative control aiming at the autonomous driving for autonomously traveling without being dependent on the operation of the driver and the like can be performed.

For example, the microcomputer 12051 can extract, on the basis of the distance information obtained from the imaging units 12101 to 12104, three-dimensional object data related to a three-dimensional object after dividing it into a motorcycle, an ordinary car, a large vehicle, a pedestrian, and other three-dimensional objects such as a utility pole, which can be used for automatic avoidance of obstacles. For example, the microcomputer 12051 distinguishes obstacles around the vehicle 12100 as an obstacle that can be visually recognized by the driver of the vehicle 12100 and an obstacle less likely to be visually recognized. Then, the microcomputer 12051 determines a collision risk indicating a degree of risk of collision with each obstacle, and in a case where the collision risk is equal to or more than a set value and there is a possibility of collision, a warning is output to the driver via the audio speaker 12061 or the display 12062, or forced deceleration or avoidance steering is performed via the drive system control unit 12010, whereby driving support for avoiding collision can be performed.

At least one of the imaging units 12101 to 12104 may be an infrared camera for detecting infrared rays. For example, the microcomputer 12051 can recognize a pedestrian by determining whether or not the pedestrian exists in the image captured by the imaging units 12101 to 12104. Such recognition of the pedestrian is performed through, for example, a procedure of extracting characteristic points in the image captured by the imaging units 12101 to 12104 as infrared cameras, and a procedure of performing pattern matching processing on a series of characteristic points indicating the outline of the object to determine whether or not it is a pedestrian. When the microcomputer 12051 determines that a pedestrian exists in the image captured by the imaging units 12101 to 12104 and the pedestrian is recognized, the audio image output unit 12052 controls the display 12062 in such a manner that a square outline for emphasizing the recognized pedestrian is displayed in a superimposed manner. Furthermore, the audio image output unit 12052 may control the display 12062 in such a manner that an icon or the like indicating the pedestrian is displayed at a desired position.

An exemplary vehicle control system to which the technology according the present disclosure can be applied has been described above. The technology according to the present disclosure can be applied to the imaging unit 12030 in the configurations described above. With the technology according to the present disclosure being applied to the imaging unit 12030, it becomes possible to obtain polarization information and image information of a subject more accurately. Accordingly, the imaging unit 12030 can supply more various types of information to the vehicle control system.

Furthermore, the technology according to the present disclosure can also be applied to a monitoring camera. With the technology according to the present disclosure being applied, the monitoring camera can obtain polarization information more accurately, whereby performance can be further improved.

Although the preferred embodiments of the present disclosure have been described in detail with reference to the accompanying drawings, the technical scope of the present disclosure is not limited to such examples. It is obvious that those skilled in the art in the technical field of the present disclosure may find various alterations and modifications within the technical ideas of the appended claims, and it should be understood that such alterations and modifications are also naturally within the technical scope of the present disclosure.

For example, although the solid-state imaging device according to the embodiments described above is for on-vehicle use or for the use of a monitoring camera, the present technology is not limited to such an example. For example, the solid-state imaging device according to the embodiments described above may be used for a general electronic apparatus or for medical use.

Furthermore, the effects described in the present specification are merely illustrative or exemplary, and are not limited. That is, the technology according to the present disclosure can exert other effects obvious to those skilled in the art from the disclosure of the present specification together with or instead of the effects described above.

Note that the following configurations are also within the technical scope of the present disclosure.

(1) A solid-state imaging device including:
a plurality of polarization pixels that obtains a polarization signal of incident light;
a semiconductor substrate on which the plurality of polarization pixels is arranged; and
a circuit layer provided on a surface facing a surface of the semiconductor substrate on which the incident light is made incident, the circuit layer including a polarization pixel circuit that performs signal processing on the polarization signal obtained by the polarization pixels, in which
a blank area that separates the plurality of polarization pixels from each other is provided over an entire circumference of the plurality of polarization pixels.

(2) The solid-state imaging device according to (1) described above, in which at least one or more normal pixels that obtain a pixel signal of a captured image from incident light are provided in the blank area.

(3) The solid-state imaging device according to (2) described above, in which the circuit layer includes a normal pixel circuit that performs signal processing on the pixel signal obtained by the normal pixel.

(4) The solid-state imaging device according to (3) described above, in which
a plurality of the normal pixels is provided in the blank area, and
the plurality of normal pixels shares the single normal pixel circuit.

(5) The solid-state imaging device according to (3) or (4) described above, in which the normal pixel circuit is not provided in the circuit layer in an area that overlaps the normal pixels in a case where the semiconductor substrate is viewed in a plan view.

(6) The solid-state imaging device according to (2) to (5) described above, in which a pixel defining film of the normal pixel and a polarizing member of the polarization pixel are provided in the same layer.

(7) The solid-state imaging device according to (1) to (6) described above, in which first wiring or second wiring is provided in the circuit layer in an area that overlaps the blank area in a case where the semiconductor substrate is viewed in a plan view.

(8) The solid-state imaging device according to (1) to (7) described above, in which the plurality of polarization pixels is arranged in a tetragonal lattice pattern with a predetermined interval in each of a first direction and a second direction orthogonal to the first direction.

(9) The solid-state imaging device according to (8) described above, in which second wiring is provided in the circuit layer in an area that overlaps the blank area provided between the plurality of polarization pixels arranged in a direction of either the first direction or the second direction.

(10) The solid-state imaging device according to (9) described above, in which first wiring extending in a direction orthogonal to the second wiring is provided in the circuit layer in an area that overlaps the plurality of polarization pixels.

(11) The solid-state imaging device according to (9) or (10) described above, in which at least one or more normal pixels that obtain a pixel signal of a captured image from incident light are provided in the blank area provided between the plurality of polarization pixels arranged in a direction different from the direction of either the first direction or the second direction.

(12) The solid-state imaging device according to (8) described above, in which at least one or more normal pixels that obtain a pixel signal of a captured image from incident light are provided on a diagonal line of the tetragonal lattice including the plurality of polarization pixels.

(13) The solid-state imaging device according to (1) to (12) described above, in which at least one or more of the plurality of polarization pixels are provided with a light-shielding structure extending in a thickness direction of the semiconductor substrate.

(14) The solid-state imaging device according to (1) to (13) described above, in which each of the plurality of polarization pixels adjacent to each other includes a polarizing member that transmits light in a polarization direction different from each other.

(15) The solid-state imaging device according to (14) described above, in which the polarizing member includes a wire grid.

(16) The solid-state imaging device according to (1) to (15) described above, in which the incident light includes infrared rays or near infrared rays.

(17) An electronic apparatus including:
a solid-state imaging device that electronically images an object, in which
the solid-state imaging device includes:
a plurality of polarization pixels that obtains a polarization signal of incident light;
a semiconductor substrate on which the plurality of polarization pixels is arranged; and
a circuit layer provided on a surface facing a surface of the semiconductor substrate on which the incident light is made incident, the circuit layer including a polarization pixel circuit that performs signal processing on the polarization signal obtained by the polarization pixels, and
a blank area that separates the plurality of polarization pixels from each other is provided over the entire circumference of the plurality of polarization pixels.

REFERENCE SIGNS LIST 10, 20, 30, 40, 50 Solid-state imaging device
100, 200, 300, 400, 500 Unit pixel
111 Substrate contact
112 Polarization pixel
113 Polarization pixel FD
114 Polarization pixel transfer TRG
115 Polarization pixel driving TRG group
116 Normal pixel driving TRG group
117 Normal pixel
118 Normal pixel FD
119 Normal pixel transfer TRG
121 Second wiring
122 First wiring 131 On-chip lens
132 Polarizing member
133 Pixel defining film
S Blank area

The invention claimed is:

1. A solid-state imaging device, comprising:
a plurality of polarization pixels configured to obtain a polarization signal of incident light;
a semiconductor substrate on which the plurality of polarization pixels is arranged; and
a circuit layer on a surface facing a surface of the semiconductor substrate on which the incident light is made incident, the circuit layer including a polarization pixel circuit that performs a first signal processing operation on the polarization signal obtained by the plurality of polarization pixels,
wherein a blank area, that separates the plurality of polarization pixels from each other, is over an entire circumference of the plurality of polarization pixels.

2. The solid-state imaging device according to claim 1, wherein at least one normal pixel of a plurality of normal pixels, configured to obtain a pixel signal of a captured image from the incident light, is in the blank area.

3. The solid-state imaging device according to claim 2, wherein the circuit layer includes a normal pixel circuit that performs a second signal processing operation on the pixel signal obtained by the at least one normal pixel.

4. The solid-state imaging device according to claim 3, wherein
the plurality of normal pixels is in the blank area, and
the plurality of normal pixels shares the normal pixel circuit.

5. The solid-state imaging device according to claim 3, wherein the normal pixel circuit is not in the circuit layer in an area that overlaps the plurality of normal pixels in a case where the semiconductor substrate is viewed in a plan view.

6. The solid-state imaging device according to claim 2, wherein a pixel defining film of the at least one normal pixel and a polarizing member of at least one polarization pixel of the plurality of polarization pixels are in a same layer.

7. The solid-state imaging device according to claim 1, wherein one of a first wiring or a second wiring is in the circuit layer in an area that overlaps the blank area in a case where the semiconductor substrate is viewed in a plan view.

8. The solid-state imaging device according to claim 1, wherein the plurality of polarization pixels is arranged in a tetragonal lattice pattern with a predetermined interval in each of a first direction and a second direction orthogonal to the first direction.

9. The solid-state imaging device according to claim 8, wherein a second wiring is in the circuit layer in an area that overlaps the blank area between the plurality of polarization pixels arranged in one of the first direction or the second direction.

10. The solid-state imaging device according to claim 9, wherein a first wiring extending in a direction orthogonal to the second wiring is in the circuit layer in an area that overlaps the plurality of polarization pixels.

11. The solid-state imaging device according to claim 9, wherein at least one normal pixel of a plurality of normal pixels, configured to obtain a pixel signal of a captured image from the incident light, is in the blank area between the plurality of polarization pixels arranged in a direction different from one of the first direction or the second direction.

12. The solid-state imaging device according to claim 8, wherein at least one normal pixel of a plurality of normal pixels, configured to obtain a pixel signal of a captured image from the incident light, is on a diagonal line of the tetragonal lattice pattern including the plurality of polarization pixels.

13. The solid-state imaging device according to claim 1, wherein at least one polarization pixel of the plurality of polarization pixels comprises a light-shielding structure extending in a thickness direction of the semiconductor substrate.

14. The solid-state imaging device according to claim 1, wherein each polarization pixel of the plurality of polarization pixels adjacent to each other includes a polarizing member that transmits light in a polarization direction different from each other.

15. The solid-state imaging device according to claim 14, wherein the polarizing member includes a wire grid.

16. The solid-state imaging device according to claim 1, wherein the incident light includes an infrared ray or a near infrared ray.

17. An electronic apparatus comprising:
a solid-state imaging device that electronically images an object, wherein the solid-state imaging device includes:
a plurality of polarization pixels configured to obtain a polarization signal of incident light;
a semiconductor substrate on which the plurality of polarization pixels is arranged; and
a circuit layer on a surface facing a surface of the semiconductor substrate on which the incident light is made incident, the circuit layer including a polarization pixel circuit that performs signal processing on the polarization signal obtained by the plurality of polarization pixels, and
a blank area, that separates the plurality of polarization pixels from each other, over an entire circumference of the plurality of polarization pixels.

* * * * *